United States Patent
Li et al.

(10) Patent No.: US 12,170,543 B2
(45) Date of Patent: Dec. 17, 2024

(54) OPTICAL RECEIVER CHIP BASED ON OTN TRANSMISSION TECHNOLOGY

(71) Applicant: XIAMEN EOCHIP SEMICONDUCTOR CO., LTD, Xiamen (CN)

(72) Inventors: Jinghu Li, Xiamen (CN); Fujie Chen, Xiamen (CN); Hanghui Tu, Xiamen (CN)

( * ) Notice: Subject to any disclaimer, the term of this patent is extended or adjusted under 35 U.S.C. 154(b) by 0 days.

(21) Appl. No.: 18/240,611

(22) Filed: Aug. 31, 2023

(65) Prior Publication Data
US 2024/0072906 A1   Feb. 29, 2024

(30) Foreign Application Priority Data
Aug. 31, 2022 (CN) .......................... 202211057905.3

(51) Int. Cl.
H04B 10/60 (2013.01)
H03L 7/08 (2006.01)

(52) U.S. Cl.
CPC ........... H04B 10/60 (2013.01); H03L 7/0807 (2013.01)

(58) Field of Classification Search
CPC .... H04B 10/60; H04B 10/693; H04B 10/697; H03L 7/0807
See application file for complete search history.

(56) References Cited

U.S. PATENT DOCUMENTS

| 2012/0148236 A1 | 6/2012 | Kumar et al. | |
|---|---|---|---|
| 2015/0086221 A1* | 3/2015 | Shringarpure | H03F 1/0205 359/344 |
| 2019/0222318 A1* | 7/2019 | Bai | H04B 10/40 |

FOREIGN PATENT DOCUMENTS

| CN | 101185247 A | 5/2008 |
|---|---|---|
| CN | 114614900 A | 6/2022 |

* cited by examiner

*Primary Examiner* — Tanya T Motsinger
(74) *Attorney, Agent, or Firm* — Novoclaims Patent Services LLC; Mei Lin Wong

(57) ABSTRACT

An optical receiver chip based on OTN transmission technology to solve the high power consumption and serous signal attenuation problems for data transmission below 100 m in the data center includes a receiver, a digital control unit, and a power module. The receiver includes a 28G transimpedance amplifier and a limiting amplifier, converts a weak optical signal into an electrical signal, process a two-stage amplification, and output the signal in a limited state. The signal is then processed by a photodiode into a DC current RSSI, and judged by the internal received signal strength indicator module or the internal optical modulation amplitude loss of signal module of the limiting amplifier. If the signal does not meet the protocol requirements, the output buffer with de-emphasis and the linear equalizer are turned off, and the judgment result is transmitted to the host computer outside the chip simultaneously.

4 Claims, 2 Drawing Sheets

OPTICAL RECEIVER CHIP BASED ON OTN TRANSMISSION TECHNOLOGY

CROSS REFERENCE OF RELATED APPLICATION

This is a non-provisional application which claimed priority of Chinese application number 202211057905.3, filing date 31 Aug. 2022. The contents of these specifications, including any intervening amendments thereto, are incorporated herein by reference.

FIELD OF INVENTION

The present invention relates to the field of integrated circuit and optical communication.

DESCRIPTION OF RELATED ARTS

In order to prevent the downward trend of the economy and stimulate the vitality of the market economy, the central government proposed to complete the trillion-level infrastructure "rescue" plan in the next few years. Large-scale infrastructure includes not only traditional infrastructure such as roads, airports, bridges, water conservancy, and etc., but also puts forward the concept of "moderately advanced infrastructure construction", that is, new infrastructure, which includes the new engine needed on the road of China's economic development in the future: 5G network, UHV transmission, industrial Internet, artificial intelligence, big data center, etc. Therefore, the new infrastructure must be supported by high-speed data transmission in order to complete the historical task of economic transformation.

The optical chips in the big data center are assigned different application scenarios according to the transmission distance: (1)<20 m, interconnected in-cabinet server and TOR switches; (2)<500 m, interconnected leaf-to-spine switches in the same equipment room of the data center; (3)<10 km, interconnected switches or routers of different data center buildings; (4)>10 km, interconnected multiple data centers. The short-distance data transmission below 100 m is mainly based on 850 nm wavelength multimode fiber, which realizes channel multiplexing and improves the transmission rate.

At present, the widely used transmission technologies include two categories: MSTP/SDH technology and WDM technology.

Wherein, MSTP/SDH technology focuses on the electrical layer processing of services, and has good scheduling, management and protection capabilities. Among them, MSTP (Multi-Service Transport Platform) is a multi-service transmission platform, SDH (Synchronous Digital Hierarchy) is a synchronous digital system, and The OAM (Operation Administration and Maintenance) function of MSTP/SDH technology is complete. However, MSTP/SDH technology uses VC4 (Virtual Container virtual container) as the main cross-connect particle and adopts single-channel lines. The cross-connect particle and capacity growth are gradually insufficient for supporting large-particle, high-speed, and packet-based services. Another transmission technology, WDM (Wavelength Division Multiplexing, wavelength division multiplexing) technology, focuses on the optical layer processing of services. The transmission characteristics of the multi-wavelength channel determine that it has the natural advantage of providing large-capacity transmission. However, the current WDM network mainly adopts the point-to-point application mode and lacks flexible service scheduling means.

In order to overcome the shortcomings of MSTP/SDH technology and WDM technology, the OTN technology (Optical transport network, Optical Transport Network), which is in one of the development directions of the new generation of transport network, is developed. It applies the operable and manageable capabilities of SDH to the WDM system, and has the advantages of SDH and WDM at the same time, and meets the transmission requirements of multi-service, large capacity, high reliability and high quality to a greater extent.

When the OTN technology to short-distance data transmission below 100 m in the data center is used in application, in the RX (Receiver) receiver chip in the data center application, the TIA (transimpedance amplifier) converts the received weak optical signal into an electrical signal and amplifies the signal, and the next-stage LA (limiting amplifier) further amplifies the electrical signal to a limiting status. LA also includes a LOS (Loss of Signal, loss of signal) module, which judges whether the LA input signal is noise or a level signal that meets the requirements and performs squelch or normal operation.

However, the problems of OTN are: the TIA is arranged outside the chip requires a driver stage to drive the input of LA, resulting in high power consumption of the chip; the TIA which is arranged outside the chip will also cause serious signal attenuation on the PCB board. Furthermore, the internal of the RX needs to start different signal transmission paths according to the attenuation degree of the signal, or optimize the signal through the adjustment of functional modules.

Therefore, in view of the above deficiencies, it is necessary to provide a chip based on OTN technology for short-distance data transmission below 100 m in the data center, so that its power consumption is small and the signal attenuation degree is small

SUMMARY OF THE PRESENT INVENTION

In view of the OTN technology-based chips for the existing short-distance data transmission below 100 m in the data center having the problems of high power consumption and serious signal attenuation on PCB boards, the present invention provides an overall frame structure of an optical receiver chip based on OTN transmission technology in which the TIA, which has relatively high requirements, are integrate into the RX chip internally, saving the manufacturing cost and the cost of use, meeting the packaging requirements in application scenarios. The LA part can perform amplitude detection or average value detection on the signal transmitted by the upper TIA, and turn off the squelch function after meeting the requirements. The input module CTLE (Continuous Time Linear Equalizer) and output driver (CML Buffer) transmit data normally. The built-in CDR of the LA section optimizes transmission signals for high-speed attenuation. The digital part Digital communicates with the host through two signal lines SCL and SDA to realize the control of the internal parameters of the optical receiver chip and the optimization of data transmission quality. In order to meet the strict control of chip power consumption by the data center, the built-in DCDC can reduce the overall power consumption of the optical receiver chip, reduce the hardware cost of the optical module, and facilitate the miniaturization of the optical module.

According to the present invention, an optical receiver chip based on OTN transmission technology comprises: a receiver RX, a digital control unit DIGITAL, and a power module POWER;

the digital control unit DIGITAL provides a control signal to the receiver RX;

the power module POWER is arranged to provide working power to the chip;

the receiver RX comprises a 28 G transimpedance amplifier 28G_TIA and a limiting amplifier LA, the 28 G transimpedance amplifier 28G_TIA converts a received optical signal, which is usually weak in nature, into an electrical signal and amplifies the signal, and in a next-stage, a limiting amplifier LA further amplifies the electrical signal to a limiting state and outputs the signal; in order to reduce noise interference in the case of no light or small light, a squelch function is integrated in the receiving module, a negative terminal of a photodiode PD outputs a high-frequency current, which is a weak current in nature, and processes low-pass filtering and mirroring into a DC current RSSI, which is then processed by the internal received signal strength indicator module RSSI LOS of the limiting amplifier LA to judge whether the signal meets the protocol requirements, if the requirements are not met, the output buffer CML_BUFF with de-emphasis and the linear equalizer CTLE inside the limiting amplifier LA are turned off, and the judgment result is transmitted to the host computer outside the chip simultaneously; or the optical modulation amplitude loss of signal module OMA LOS of the internal module of the limiting amplifier LA is arranged to judge whether the amplified electrical signal output by the 28 G transimpedance amplifier 28G_TIA meets a preset threshold requirements, if the requirements are not met, the output buffer CML_BUFF with de-emphasis and the linear equalizer CTLE inside the limiting amplifier LA are turned off, and the judgment result is transmitted to the host computer outside the chip simultaneously.

Preferably, the limiting amplifier LA inside the receiver RX comprises a linear equalizer CTLE, an optical modulation amplitude loss of signal module OMA LOS, a received signal strength indicator module RSSI LOS, a multi-rate clock data recovery module CDR, a signal bypass ByPass, and a fiber channel mode rate decision module FC_mode_Rate_decision, a data selector MUX, a monitor clock MONITOR CLOCK and an output buffer CML_BUFF with de-emphasis;

an input terminal of the 28 G transimpedance amplifier 28G_TIA is connected to a positive terminal of the photodiode PD through a chip pin PINA, a negative terminal of the photodiode PD is connected to a chip pin PINK, two output terminals of the 28 G transimpedance amplifier 28G_TIA are respectively connected to two input terminals of the linear equalizer CTLE and two input terminals of the optical modulation amplitude loss of signal module OMA LOS;

the 28 G transimpedance amplifier 28G_TIA outflows RSSI monitoring current to received signal strength indicator module RSSI LOS;

control signal output terminals of both the optical modulation amplitude loss of signal module OMA LOS and the received signal strength indicator module RSSI LOS are respectively connected to a control terminal of the linear equalizer CTLE, a control terminal of the output buffer CML_BUFF with de-emphasis and a chip pin RX_LOS;

an output terminal of the linear equalizer CTLE is respectively connected to an input terminal of the multi-rate clock data recovery module CDR, an input terminal of the signal bypass ByPass and an input terminal of the fiber channel mode rate decision module FC_mode_Rate_decision;

a control signal of the fiber channel mode rate decision module FC_mode_Rate_decision is output to one of a control port of the multi-rate clock data recovery module CDR and a control port of ByPass;

a data signal output terminal of the multi-rate clock data recovery module CDR is connected to an input terminal of the data selector MUX;

a data signal output terminal of the signal bypass ByPass is connected to another input terminal of the data selector MUX;

an output terminal of the data selector MUX is connected to an input terminal of the output buffer CML_BUFF with de-emphasis;

a clock output terminal of the multi-rate clock data recovery module CDR is connected to an input terminal of the monitor clock module MONITOR CLOCK;

the positive and negative output terminals of the monitoring clock module MONITOR CLOCK are respectively connected to chip pins MCLKP and MCLKN;

two output terminals of the output buffer CML_BUFF with de-emphasis are respectively connected to chip pins OUTP and OUTN.

Preferably, the linear equalizer CTLE performs high-frequency compensation on the attenuated signal output by the 28 G transimpedance amplifier 28G_TIA, and the fiber channel mode rate decision module FC_mode_Rate_decision selects one of the multi-rate clock data recovery module CDR and the signal bypass ByPass as the signal path, the method of selecting one of the multi-rate clock data recovery module CDR and the signal bypass ByPass as the signal path comprises two method types:

a first type: in FC mode, the fiber channel mode rate decision module FC_mode_Rate_decision is activated, if a signal detected by the fiber channel mode rate decision module FC_mode_Rate_decision is 8 G FC, the fiber channel mode rate decision module FC_mode_Rate_decision controls to activate the signal bypass ByPass as the selected signal path; if a signal detected by the fiber channel mode rate decision module FC_mode_Rate_decision is 16 G/32 G FC, the fiber channel mode rate decision module FC_mode_Rate_decision controls to activate the multi-rate clock data recovery module CDR as the selected signal path;

a second type: in non-FC mode, the signal bypass ByPass is the signal path with a signal rate is 1~28.1 Gbps; the multi-rate clock data recovery module CDR supports the signal path with a 19~28.1 Gbps signal rate or the signal path with a 19/2~28.1/2 Gbps signal rate, the signal path and a clock rate selection are configured by a digital register.

Preferably, the digital control unit DIGITAL comprises an analog-to-digital converter ADC, a I²C slave, a control register digital core Register Control Digital Core, a TIA analog circuit part control port and a LA analog circuit part control port; wherein the TIA analog circuit part control port comprises a rate selection RS, a temperature compensation TC, a variable gain amplifier VGA and a received signal strength indication gain RSSI GAIN, the LA analog circuit part control port comprises linear equalizer CTLE, eye cross point adjustment CPA, loss of signal threshold setting LOS_TH, clock data recovery loop bandwidth adjustment CDR_LBW, output swing adjustment OP_SWING and de-emphasis adjustment DEEMPH;
- an input terminal of I²C slave is connected to a chip pin SCL;
- input and output ports of the I²C slave are connected to a chip pin SDA;
- the analog-to-digital converter ADC receives a temperature signal TEMP, a monitoring current RSSI and a voltage signal VCC,
- a digital output terminal of the analog-to-digital converter ADC is connected to an input terminal of the digital control register core Register Control Digitalcore;
- the control register digital core Register Control Digital Core outputs control signals to TIA's rate selection RS, temperature compensation TC, variable gain amplifier VGA and received signal strength indicator gain RSSI GAIN respectively;
- the control register digital core Register Control Digital Core outputs control signals to the linear equalizer CTLE, eye cross point adjustment CPA, loss of signal threshold setting LOS_TH, clock data recovery loop bandwidth adjustment CDR_LBW, output swing adjustment OP_SWING and de-emphasis adjustment DEEMPH respectively.

Preferably, the power module POWER comprises a DC chopper DC/DC, resistors R33 and R34;
- the DC power supply VDC provides working power for the laser driver, at the same time, the DC chopper DC/DC converts the DC power supply VDC into a DC power VCC1.8V and outputs through a pin VOUT, the DC power VCC1.8V provides working power for the limiting amplifier LA of the RX receiver and the digital control unit Digital respectively;
- an output terminal VOUT of the DC chopper DC/DC is simultaneously connected to one end of the resistor R33 and a chip pin CAP; the chip pin CAP is grounded through a capacitor C11;
- another end of the resistor R33 is simultaneously connected to one end of the resistor R44 and a feedback signal terminal FB of the DC chopper DC/DC;
- another end of the resistor R44 is connected to ground;
- a switch input port SW of the DC chopper DC/DC is connected to a chip pin SW; the chip pin SW is connected to a positive electrode of the DC power supply VDC through an inductor L11;
- a power supply voltage port VCC of the DC chopper DC/DC is connected to a chip pin VCC; the chip pin VCC is connected to the positive electrode of the DC power supply VDC; an enable port EN of the DC chopper DC/DC is connected to a chip pin EN; the chip pin EN is simultaneously connected to one end of a capacitor C22 and the positive electrode of the DC power supply VDC; another end of the capacitor C22 is grounded, and a negative electrode of the DC power supply VDC is grounded.

The advantageous effect of the present invention: The present invention provides an overall framework structure of an optical receiver chip based on the OTN transmission technology, which integrates the external 28 GbpsTIA into the receiver chip RX internally, and changes the AC coupling output to DC coupling output, thus saving the output driver stage of the TIA, reducing the power consumption of the TIA stage, and effectively reducing the signal attenuation caused by the PCB board when the TIA is external. The LA in the RX has two signal loss detection methods to accurately identify the authenticity of the signal, and includes two signal paths, CDR and Bypass. The signal path can be flexibly selected according to the signal rate, and the performance parameters of each module can be adjusted through digital registers to optimize the data transmission quality and overall power consumption. The built-in power management module can well control the overall power consumption of the chip and meet the strict requirements of the data center on power consumption and heat dissipation. Overall, in terms of performance, area and power consumption, a competitive advantage is formed.

DETAILED DESCRIPTION OF THE PREFERRED EMBODIMENT

The following will clearly and completely describe the technical solutions in the embodiments of the present invention with reference to the accompanying drawings in the embodiments of the present invention. Clearly, the described embodiments are only some, not all, of the embodiments of the present invention. Based on the embodiments of the present invention, all other embodiments obtained by persons of ordinary skill in the art without inventive steps fall within the protection scope of the present invention.

The present invention provides an overall framework structure of an optical receiver chip based on the OTN transmission technology, The above are the keys to the realization of the invention.

It should be noted that, in the case of no conflict, the embodiments of the present invention and the features in the embodiments can be combined with each other.

The present invention is further described below with the accompanying drawings and specific embodiments, but not serving as limitations of the present invention.

Figure 1:
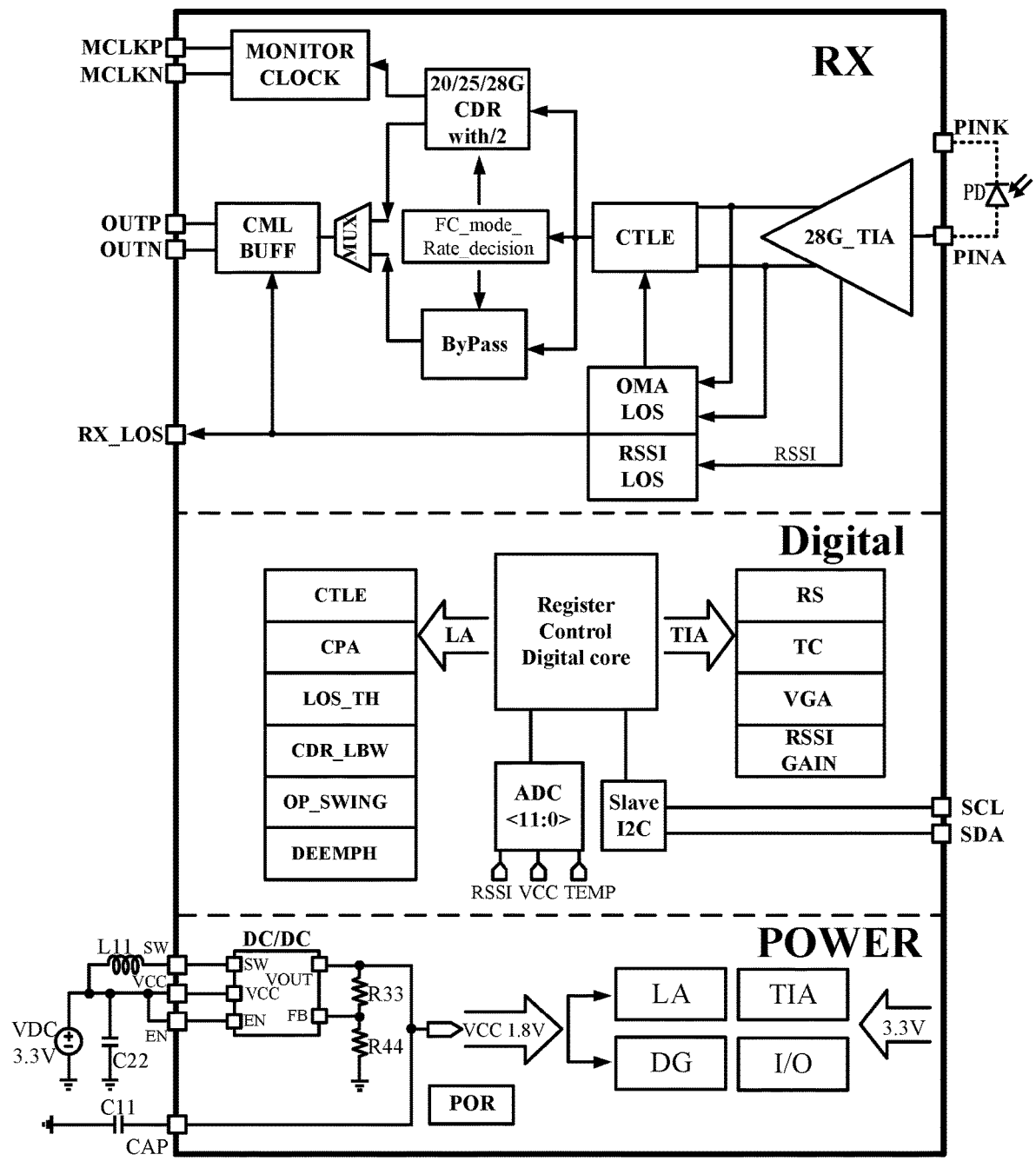
FIG. 1 is a schematic structural diagram of the optical receiver chip based on OTN transmission technology of the present invention.

Preferred Embodiment 1: This embodiment is described below in conjunction with FIG. 1. According to this embodiment, an optical receiver chip based on OTN transmission technology comprises a receiver RX, a digital control unit Digital and a power module POWER;
- the digital control unit Digital is arranged to provide a control signal to the receiver RX;
- the power module POWER is arranged to provide working power for the chip;
- a limiting amplifier LA of the receiver RX comprises a linear equalizer CTLE, an optical modulation amplitude loss of signal module OMA LOS, a received signal strength indicator module RSSI LOS, a multi-rate clock data recovery module CDR, a signal bypass ByPass, and a fiber channel mode rate decision module FC_mode_Rate_decision, a data selector MUX, a monitor clock MONITOR CLOCK and an output buffer CML_BUFF with de-emphasis;
- an input terminal of a 28 G transimpedance amplifier 28G_TIA is connected to a positive terminal of the photodiode PD through a chip pin PINA, a negative terminal of the photodiode PD is connected to a chip pin PINK, two output terminals of the 28 G transimpedance amplifier 28G_TIA are respectively connected to two input terminals of the linear equalizer CTLE and two input terminals of the optical modulation amplitude loss of signal module OMA LOS;

a RSSI monitoring current from the 28 G transimpedance amplifier 28G_TIA is transmitted to the received signal strength indicator module RSSI LOS;

control signal output terminals of both the optical modulation amplitude loss of signal module OMA LOS and the received signal strength indicator module RSSI LOS are respectively connected to a control terminal of the linear equalizer CTLE, a control terminal of the output buffer CML_BUFF with de-emphasis and a chip pin RX_LOS (In other words, the control signal output terminal of the optical modulation amplitude loss of signal module OMA LOS is respectively connected to a control terminal of the linear equalizer CTLE, a control terminal of the output buffer CML_BUFF with de-emphasis and a chip pin RX_LOS; and the control signal output terminal of the received signal strength indicator module RSSI LOS is respectively connected to a control terminal of the linear equalizer CTLE, a control terminal of the output buffer CML_BUFF with de-emphasis and a chip pin RX_LOS);

an output terminal of the linear equalizer CTLE is respectively connected to an input terminal of the multi-rate clock data recovery module CDR, an input terminal of the signal bypass ByPass and an input terminal of the fiber channel mode rate decision module FC_mode_Rate_decision;

a control signal of the fiber channel mode rate decision module FC_mode_Rate_decision is output to one of the two control ports, which are a control port of the multi-rate clock data recovery module CDR and a control port of ByPass;

a data signal output terminal of the multi-rate clock data recovery module CDR is connected to an input terminal of the data selector MUX;

a data signal output terminal of the signal bypass ByPass is connected to another input terminal of the data selector MUX;

an output terminal of the data selector MUX is connected to an input terminal of the output buffer CML_BUFF with de-emphasis;

a clock output terminal of the multi-rate clock data recovery module CDR is connected to an input terminal of the monitor clock module MONITOR CLOCK;

the positive and negative output terminals of the monitoring clock module MONITOR CLOCK are respectively connected to chip pins MCLKP and MCLKN;

two output terminals of the output buffer CML_BUFF with de-emphasis are respectively connected to chip pins OUTP and OUTN.

The receiver chip located in the data center undertakes point-to-point massive data reception, so the performance of the high-speed front-end amplifier of the receiver chip, that is, the transimpedance amplifier TIA, is extremely important.

The TIA receives the high-frequency current (which is a weak current) from the input terminal of the anode of the photodiode PD, and converts it into an electrical signal of a certain amplitude and outputs it to the next stage LA to further amplify the signal to the limiting state. The cathode input terminal PINK of the photodiode PD outputs a high-frequency current (which is a weak current), which is filtered by a low pass and mirrored into a DC current for the RSSILOS (Received Signal Strength Indication, Loss Of Signal received signal strength indication) module to judge whether the signal size meets the protocol requirements. If the requirements are not met, the CML BUFF and CTLE modules are turned off, and the judgment result is passed to the host outside the chip (through the RX_LOS pin). Alternately, OMALOS (optical modulation amplitude, Los Of Signal optical modulation amplitude) may be used to judge whether the TIA output amplified electrical signal meets the set threshold requirements. If the requirements are not met, the CML BUFF and CTLE modules are turned off, and the judgment result is passed to the host outside the chip (through the RX_LOS pin). The resulting benefits of the built-in TIA are divided into the following points: (1) The footprint of the off-chip circuit is reduced; (2) the AC coupling capacitor is eliminated and direct connection to the input stage CTLE of the LA by DC coupling is utilized, which avoids the need for the output stage of the TIA to drive the AC coupling capacitor of the original design with, which requires large power consumption; (3) The internal optimization of output wiring is used to avoid the attenuation of high-speed signals by the original PCB wiring, which reduces the pressure of subsequent circuit CTLE and CDR on signal optimization. The linear equalizer CTLE performs high-frequency compensation on the attenuated signal output by the 28 G transimpedance amplifier 28G_TIA. Due to the possibility of device mismatch in process manufacturing, the intersection point of the eye diagram deviates from the center point of 50% of the eye height and the fundus (the eye intersection point may be at 70%), therefore, the built-in OC offset cancel loop can automatically correct the offset, or the deviated eye intersection can be pulled back to 50% position through the CPA module.

Preferred Embodiment 2: This embodiment includes further limitations of preferred embodiment 1.

The fiber channel mode rate decision module FC_mode_Rate_decision selects one of the multi-rate clock data recovery module CDR and the signal bypass ByPass as the signal path. Two methods can be used to selects one of the multi-rate clock data recovery module CDR and the signal bypass ByPass as the signal path:

a first type: in FC mode, the fiber channel mode rate decision module FC_mode_Rate_decision is activated, if a signal detected by the fiber channel mode rate decision module FC_mode_Rate_decision is 8 G FC, the fiber channel mode rate decision module FC_mode_Rate_decision controls to activate the signal bypass ByPass as the selected signal path; if a signal detected by the fiber channel mode rate decision module FC_mode_Rate_decision is 16 G/32 G FC, the fiber channel mode rate decision module FC_mode_Rate_decision controls to activate the multi-rate clock data recovery module CDR as the selected signal path a second type: in non-FC mode, the signal bypass ByPass is the signal path with a signal rate is 1~28.1 Gbps; the multi-rate clock data recovery module CDR supports the signal path with a 19~28.1 Gbps signal rate or the signal path with a 19/2~28.1/2 Gbps signal rate, the signal path and a clock rate selection are configured by a digital register The locked clock of the CDR can be divided by 8/16 through the MONITOR CLOCK module and then output to the outside of the chip as a Trigger trigger signal.

The output stage is a current mode logic output circuit, which cooperates with the de-emphasis circuit, which can effectively increase the rise and fall speed of the signal Preferred Embodiment 3: This embodiment includes further limitations of Preferred Embodiment 1 or 2.

The digital control unit DIGITAL comprises an analog-to-digital converter ADC, a I²C slave Slave I²C, a control register digital core Register Control Digital Core, a TIA analog circuit part control port and a LA analog circuit part control port; wherein the TIA analog circuit part control port comprises a rate selection RS, a temperature compensation TC, a variable gain amplifier VGA and a received signal strength indication gain RSSI GAIN, the LA analog circuit part control port comprises linear equalizer CTLE, eye cross point adjustment CPA, loss of signal threshold setting LOS_TH, clock data recovery loop bandwidth adjustment CDR_LBW, output swing adjustment OP_SWING and de-emphasis adjustment DEEMPH;

an input terminal of I²C slave is connected to a chip pin SCL;

input and output ports of the I²C slave are connected to a chip pin SDA;

the analog-to-digital converter ADC receives a temperature signal TEMP, a monitoring current RSSI and a voltage signal VCC;

a digital output terminal of the analog-to-digital converter ADC is connected to an input terminal of the digital control register core Register Control Digitalcore;

the control register digital core Register Control Digital Core outputs control signals to TIA's rate selection RS, rate selection RS, temperature compensation TC, variable gain amplifier VGA and received signal strength indicator gain RSSI GAIN respectively;

the control register digital core Register Control Digital Core outputs control signals to the linear equalizer CTLE, eye cross point adjustment CPA, loss of signal threshold setting LOS_TH, clock data recovery loop bandwidth adjustment CDR_LBW, output swing adjustment OP_SWING and de-emphasis adjustment DEEMPH respectively. The digital control unit Digital can complete the internal configuration of TIA and LA.

The TIA may have the internal configuration function of:

the rate selection RS, the temperature compensation TC (to compensate the problem of decreased bandwidth under high temperature), the variable gain amplifier VGA (to adjust the increase of TIA) and the received signal strength indication gain RSSI GAIN (to adjust the monitoring current size of the mirrored image).

The LA may have the internal configuration function of:

the linear equalizer CTLE (to adjust high-frequency strength compensation), the eye cross point adjustment CPA, the loss of signal threshold setting LOS_TH, the clock data recovery loop bandwidth adjustment CDR_LBW, the output swing adjustment OP_SWING, the de-emphasis adjustment DEEMPH and etc.

The 12-bit high-precision ADC will convert some key information inside the chip, such as: the current value of the monitoring current RSSI, power supply voltage of VCC, and internal ambient temperature of TEMP, from analog to digital and store in digital registers, read out from I²C slave to the outside of the chip for the host to monitor whether the working status of the chip is safe.

Preferred Embodiment 4: This embodiment includes further limitations of Preferred Embodiment 1, 2 or 3.

The power module POWER comprises a DC chopper DC/DC, resistors R33 and R34; the DC power supply VDC provides working power supply for the laser driver, at the same time, the DC chopper DC/DC converts the DC power supply VDC into a DC power VCC1.8V and outputs through a pin VOUT, the DC power VCC1.8V provides working power for the limiting amplifier LA of the RX receiver and the digital control unit Digital respectively; an output terminal VOUT of the DC chopper DC/DC is simultaneously connected to one end of the resistor R33 and a chip pin CAP; the chip pin CAP is grounded through a capacitor C11; another end of the resistor R33 is simultaneously connected to one end of the resistor R44 and a feedback signal terminal FB of the DC chopper DC/DC; another end of the resistor R44 is connected to ground; a switch input port SW of the DC chopper DC/DC is connected to a chip pin SW; the chip pin SW is connected to a positive electrode of the DC power supply VDC through an inductor L11; a power supply voltage port VCC of the DC chopper DC/DC is connected to a chip pin VCC; the chip pin VCC is connected to the positive electrode of the DC power supply VDC; an enable port EN of the DC chopper DC/DC is connected to a chip pin EN; the chip pin EN is simultaneously connected to one end of a capacitor C22 and the positive electrode of the DC power supply VDC; another end of the capacitor C22 is grounded, and a negative electrode of the DC power supply VDC is grounded.

Since the application scenario of this chip is a data center, the data center is very sensitive to the power consumption and size of the product, so it is necessary to reduce the power consumption and area of the receiver chip as much as possible.

The first solution of traditional receiver chip power supply is to provide the receiver chip with a power supply voltage of 3.3V, and then reduce the 3.3V power supply voltage to 1.8V through the LDO inside the chip. The efficiency of the LDO as a power supply is usually low. The overall power consumption of this solution chip is 330 mW. The present invention uses the DC/DC with higher power supply efficiency to replace LDO with lower power supply efficiency. The power supply voltage generated by the DC/DC is supplied to LA (limiting amplifier), DG part (digital control unit Digital). The power supply voltage of the TIA and I/O part are supplied after the 3.3V power supply voltage is passed through other step-down methods. The overall power consumption of this embodiment is 225 mW, saving 105 mW power consumption.

In the second solution of traditional receiver chip power supply externally equipped with a DC/DC chip, the initial 3.3V of the power supply voltage is reduced to 1.8V and supply to the receiver chip, the DC/DC chip of this solution needs to be purchased separately, the price is high and the PCB board area is occupied, and the noise on the PCB board will be strung into the chip along with the metal wires, which greatly affects the quality of the transmitted signal, and is not conducive to the cost reduction and miniaturization of optical modules in the data center; also, the generalized DC/DC cannot meet the increasingly digital design requirements of receiver chips. When compared to the second solution, the present invention designs a DC/DC built into the receiver chip according to the power consumption requirements of the receiver chip. This customized DC/DC has the characteristics of small area and strong performance, and the cost and power consumption of the whole module are reduced.

The DC/DC is further optimized in terms of area. For example, the generation of the reference voltage can be uniformly provided by the bandgap reference voltage module in the chip, and the sawtooth wave oscillator can also be synthesized by the same oscillator in the chip. The size of the switch tube SW, which occupies the largest chip layout area, can be reasonably designed according to the overall demand power consumption of the chip. After area optimization in various aspects, the area of the DC/DC module is only 0.7 mm², while the occupied area of a single DC/DC is 4 mm². The resistance of resistors R33 and R44 can be adjusted to change the output voltage (as long as the receiver chip can still guarantee the performance under low voltage conditions, the 1.8V power supply voltage can also be lowered to further reduce the overall power consumption). The DC/DC module can also be designed as multiple voltage output ports to meet the needs of different power domains on-chip. The ways to adjust the output voltage include laser trimming and fuse trimming, one-time programmable (OTP) and register programming, etc.

During the power onset process, the chip first resets through the POR (poweronreset) module and then starts all functional modules.

The optical receiver chip based on OTN transmission technology described in Embodiments 1 to 4 has a built-in TIA with a rate of 28 Gbps, thus reducing the footprint and avoiding the attenuation and distortion of the output signal after passing through the PCB wiring, and its working rate can also pass through host control. The LA part can perform high-frequency compensation on the attenuated signal through the CTLE linear equalizer, and adjust the CPA at the eye cross point after compensation, so that the signal can be further restored. Finally, after the high-performance CDR extracts the clock recovery signal, it is transmitted to off-chip by an output stage with de-emphasis function, which improves the quality of the signal. The digital part has built-in multi-bit registers, high-precision ADC and slave I²C, which can transmit various key data to the outside through the SDA signal line, and this line can also be used for writing the digital quantity of related modules with optimized performance, therefore ensuring that the receiving signal and the sending model of the transceiver integrated chip have high quality.

Figure 2:
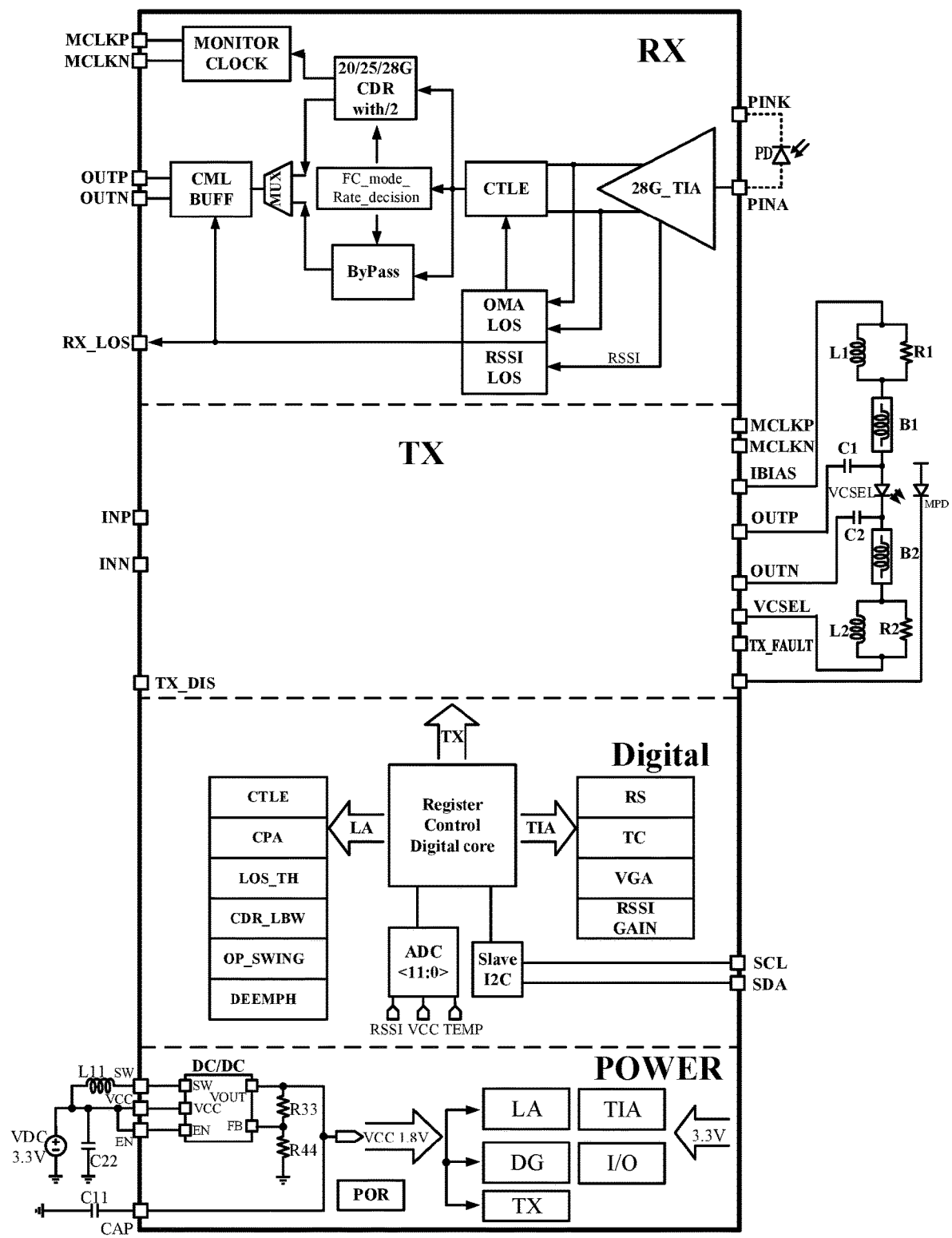
FIG. 2 is a schematic diagram of an integrated transceiver chip constructed by using the optical receiver chip based on OTN transmission technology of the present invention.

Preferred Embodiment 5: This embodiment is shown in FIG. 2. This embodiment adopts the optical receiver chip based on OTN transmission technology as described in the Preferred Embodiments 1 to 4 to construct a transceiver integrated chip.

The optical transceiver integrated chip based on OTN transmission technology comprises a receiver RX, a transmitter TX, a digital control unit Digital and a power module POWER.

The digital control unit Digital is used to provide control signals to the receiver RX and the transmitter TX.

The power module POWER is used to provide working power supply for the chip.

The receiver RX adopts the optical receiver chip based on the OTN transmission technology as described in the Preferred Embodiments 1 to 4, and the transmitter TX adopts the existing technology to realize.

The digital control unit Digital and the power module POWER used for the transceiver integrated chip may appropriately increase the internal functional modules for the TX chip.

Although the present invention is described herein with reference to specific embodiments, it should be understood that these embodiments are merely illustrative of the principles and applications of the present invention. It is therefore to be understood that numerous modifications may be made to the exemplary embodiments and that other arrangements may be devised without departing from the spirit and scope of the present invention as defined by the appended claims. It shall be understood that different dependent claims and features described herein may be combined in a different way than that described in the original claims. It should also be appreciated that features described in connection with individual embodiments can be used in other described embodiments.

What is claimed is:

1. An optical receiver chip based on OTN transmission technology, characterized in that, comprising:
    a receiver RX, a digital control unit DIGIITAL and a power module POWER;
    the digital control unit DIGIITAL is arranged to provide a control signal to the receiver RX;
    the power module POWER is arranged to provide working power for the chip;
    the receiver RX comprises a 28G transimpedance amplifier 28G_TIA and a limiting amplifier LA, wherein the limiting amplifier LA comprises a linear equalizer CTLE an optical modulation amplitude loss of signal module OMA LOS, a received signal strength indicator module RSSI LOS, a multi-rate clock data recovery module CDR, a signal bypass ByPass, and a fiber channel mode rate decision module FC_mode_Rate_decision, a data selector MUX, a monitor clock MONITOR CLOCK and an output buffer CML_BUFF,
    an input terminal of the 28G transimpedance amplifier 28G_TIA is connected to a positive terminal of the photodiode PD through a chip pin PINA, a negative terminal of the photodiode PD is connected to a chip pin PINK,
    two output terminals of the 28G transimpedance amplifier 28G_TIA are respectively connected to two input terminals of the linear equalizer CTLE and two input terminals of the optical modulation amplitude loss of signal module OMA LOS,
    the 28G transimpedance amplifier 28G_TIA outflow RSSI monitoring current to received signal strength indicator module RSSI LOS,
    control signal output terminals of both the optical modulation amplitude loss of signal module OMA LOS and the received signal strength indicator module RSSI LOS are respectively connected to a control terminal of the linear equalizer CTLE, a control terminal of the output buffer CML BUFF and a chip pin RX LOS;
    an output terminal of the linear equalizer CTLE is respectively connected to an input terminal of the multi-rate clock data recovery module CDR, an input terminal of the signal bypass ByPass and an input terminal of the fiber channel mode rate decision module FC_mode_Rate_decision;
    a control signal of the fiber channel mode rate decision module FC mode Rate decision is output to one of a control port of the multi-rate clock data recovery module CDR and a control port of ByPass;
    a data signal output terminal of multi-rate clock recovery module CDR is connected to an input terminal of the data selector MUX;
    a data signal output terminal of the signal bypass ByPass is connected to another input terminal of the selector MUX;
    an output terminal of the data selector MUX is connect to an input terminal of the output buffer CML BUFF;
    a clock output terminal of the multi-rate clock data recovery module CDR is connected to an input terminal of the monitor clock module MONITOR CLOCK, the positive and negative output terminals of the monitoring clock module MONITOR CLOCK are respectively connected chip pins MCLKP and MCLKN;

two output terminals of the output buffer CML BUFF are respectively connected to chip pins OUTP and OUTN;

wherein the 28G transimpedance amplifier 28G_TIA converts a received weak optical signal into an electrical signal and amplifies the signal, and in a next-stage, a limiting amplifier LA further amplifies the electrical signal to a limiting state and outputs the signal, then the signal is determined to have a signal strength which meets the protocol requirements or a present threshold requirements by (a) or (b) respectively, wherein in (a), a negative terminal of a photodiode PD outputs a high-frequency weak current, and processes low-pass filtering and mirroring into a DC current RSSI, which is then processed by an internal received signal strength indicator module RSSI LOS of the limiting amplifier LA to judge whether the signal meets the protocol requirements, if the protocol requirements are not met, the output buffer CML BUFF and the linear equalizer CTLE inside the limiting amplifier LA are turned off, and a judgment result that the protocol requirements are not met is transmitted to the host computer outside the chip simultaneously;

wherein in (b), the optical modulation amplitude loss of signal module OMA LOS of the internal module of the limiting amplifier LA is arranged to judge whether the amplified electrical signal output by the 28G transimpedance amplifier 28G_TIA meets a preset threshold requirements, if the preset threshold requirements are not met, the output buffer CML_BUFF and the linear equalizer CTLE inside the limiting amplifier LA are turned off, and the judgment result is transmitted to the host computer outside the chip simultaneously.

2. The optical receiver chip based on OTN transmission technology according to claim 1, characterized in that, the linear equalizer CTLE performs high-frequency compensation on the attenuated signal output by the 28G transimpedance amplifier 28G_TIA, and the fiber channel mode rate decision module FC_mode_Rate_decision selects one of the multi-rate clock data recovery module CDR and the signal bypass ByPass as the signal path, the step of selecting one of the multi-rate clock data recovery module CDR and the signal bypass ByPass as the signal path comprises two methods:

a first type: in FC mode, the fiber channel mode rate decision module FC_mode_Rate_decision is activated, if a signal detected by the fiber channel mode rate decision module FC_mode_Rate_decision is 8G FC, the fiber channel mode rate decision module FC_mode_Rate_decision controls to activate the signal bypass ByPass as the selected signal path; if a signal detected by the fiber channel mode rate decision module FC_mode_Rate_decision is 16G/32G FC, the fiber channel mode rate decision module FC_mode_Rate_decision controls to activate the multi-rate clock data recovery module CDR as the selected signal path;

a second type: in non-FC mode, the signal bypass ByPass is the signal path with a signal rate is 1~28.1 Gbps; the multi-rate clock data recovery module CDR supports the signal path with a 19~28.1 Gbps signal rate or the signal path with a 19/2~28.1/2 Gbps signal rate, the signal path and a clock rate selection are configured by a digital register.

3. The optical receiver chip based on OTN transmission technology according to claim 1, characterized in that, the digital control unit DIGITAL comprises an analog-to-digital converter ADC, a I$^2$C slave, a control register digital core Register Control Digital Core, a TIA analog circuit part control port and a LA analog circuit part control port;

wherein the TIA analog circuit part control port comprises a rate selection RS, a temperature compensation TC, a variable gain amplifier VGA and a received signal strength indication gain RSSI GAIN, the LA analog circuit part control port comprises linear equalizer CTLE, eye cross point adjustment CPA, loss of signal threshold setting LOS_TH, clock data recovery loop bandwidth adjustment CDR_LBW, output swing adjustment OP_SWING and de-emphasis adjustment DEEMPH;

an input terminal of I$^2$C slave is connected to a chip pin SCL;

input and output ports of the I$^2$C slave are connected to a chip pin SDA;

the analog-to-digital converter ADC receives a temperature signal TEMP, a monitoring current RSSI and a voltage signal VCC, a digital output terminal of the analog-to-digital converter ADC is connected to an input terminal of the digital control register core Register Control Digitalcore;

the control register digital core Register Control Digital Core outputs control signals to TIA's rate selection RS, rate selection RS, temperature compensation TC, variable gain amplifier VGA and received signal strength indicator gain RSSI GAIN respectively;

the control register digital core Register Control Digital Core outputs control signals to the linear equalizer CTLE, eye cross point adjustment CPA, loss of signal threshold setting LOS_TH, clock data recovery loop bandwidth adjustment CDR_LBW, output swing adjustment OP_SWING and de-emphasis adjustment DEEMPH respectively.

4. The optical receiver chip based on OTN transmission technology according to claim 1, characterized in that: the power module POWER comprises a DC chopper DC/DC, resistors R33 and R34;

the DC power supply VDC provides working power for the laser driver, at the same time, the DC chopper DC/DC converts the DC power supply VDC into a DC power VCC1.8V and outputs through a pin VOUT, the DC power VCC1.8V provides working power for the limiting amplifier LA of the RX receiver and the digital control unit Digital respectively;

an output terminal VOUT of the DC chopper DC/DC is simultaneously connected to one end of the resistor R33 and a chip pin CAP; the chip pin CAP is grounded through a capacitor C11;

another end of the resistor R33 is simultaneously connected to one end of the resistor R44 and a feedback signal terminal FB of the DC chopper DC/DC;

another end of the resistor R44 is connected to ground;

a switch input port SW of the DC chopper DC/DC is connected to a chip pin SW;

the chip pin SW is connected to a positive electrode of the DC power supply VDC through an inductor L11;

a power supply voltage port VCC of the DC chopper DC/DC is connected to a chip pin VCC; the chip pin VCC is connected to the positive electrode of the DC power supply VDC;

an enable port EN of the DC chopper DC/DC is connected to a chip pin EN; the chip pin EN is simultaneously connected to one end of a capacitor C22 and the positive electrode of the DC power supply VDC; another end of the capacitor C22 is grounded, and a negative electrode of the DC power supply VDC is grounded.

\* \* \* \* \*